United States Patent [19]
Brug et al.

[11] Patent Number: 6,097,626
[45] Date of Patent: Aug. 1, 2000

[54] MRAM DEVICE USING MAGNETIC FIELD BIAS TO SUPPRESS INADVERTENT SWITCHING OF HALF-SELECTED MEMORY CELLS

[75] Inventors: James A. Brug, Menlo Park; Manoj K. Bhattacharyya, Cupertino, both of Calif.

[73] Assignee: Hewlett-Packard Company, Palo Alto, Calif.

[21] Appl. No.: 09/363,082

[22] Filed: Jul. 28, 1999

[51] Int. Cl.[7] .................................................... G11C 11/14
[52] U.S. Cl. ............................. 365/171; 365/173; 365/55
[58] Field of Search .................................. 365/50, 55, 66, 365/74, 171, 173, 232

[56] References Cited

U.S. PATENT DOCUMENTS

| | | | |
|---|---|---|---|
| 5,640,343 | 6/1997 | Gallagher et al. | 365/171 |
| 5,654,566 | 8/1997 | Johnson | 257/295 |
| 5,734,605 | 3/1998 | Zhu et al. | 365/173 |
| 5,793,697 | 8/1998 | Scheyerlein | 365/230.07 |

*Primary Examiner*—David Nelms
*Assistant Examiner*—Thong Le

[57] ABSTRACT

In a Magnetic Random Access Memory device, a magnetic field bias is applied to half-selected memory cells during a write operation. The magnetic field bias suppresses the inadvertent switching of the half-selected memory cells.

17 Claims, 5 Drawing Sheets

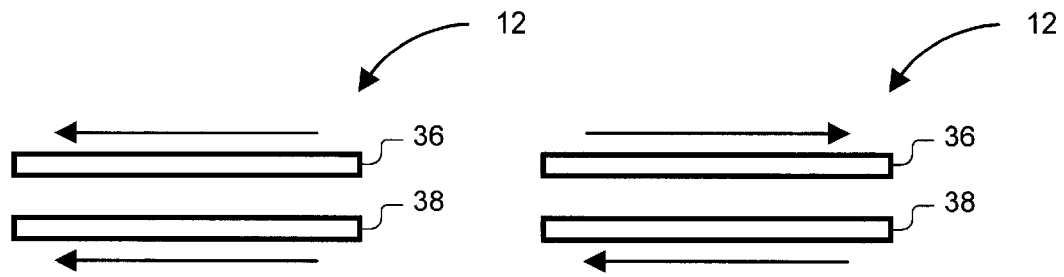
FIG. 2a  FIG. 2b
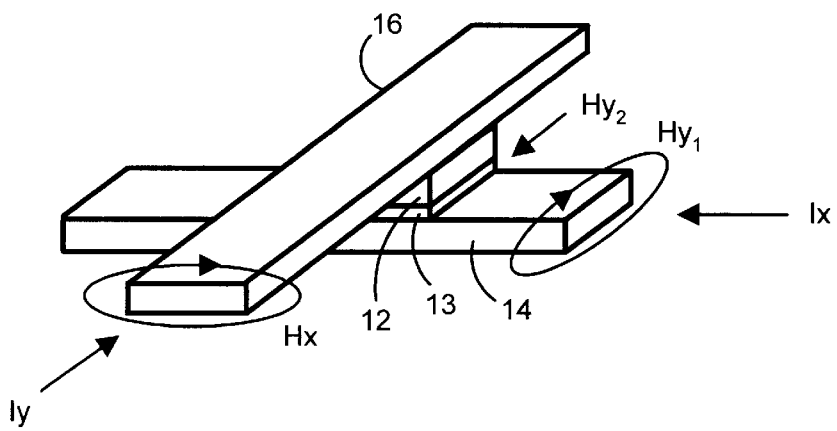
FIG. 3
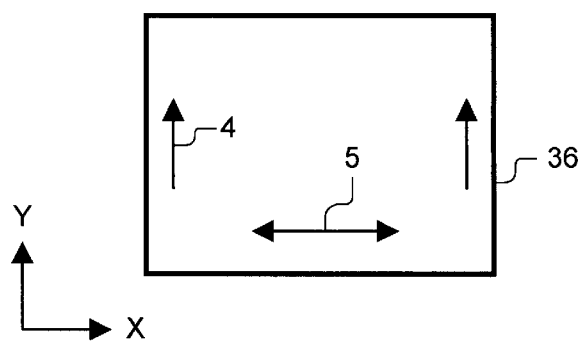
FIG. 4

FIG. 5
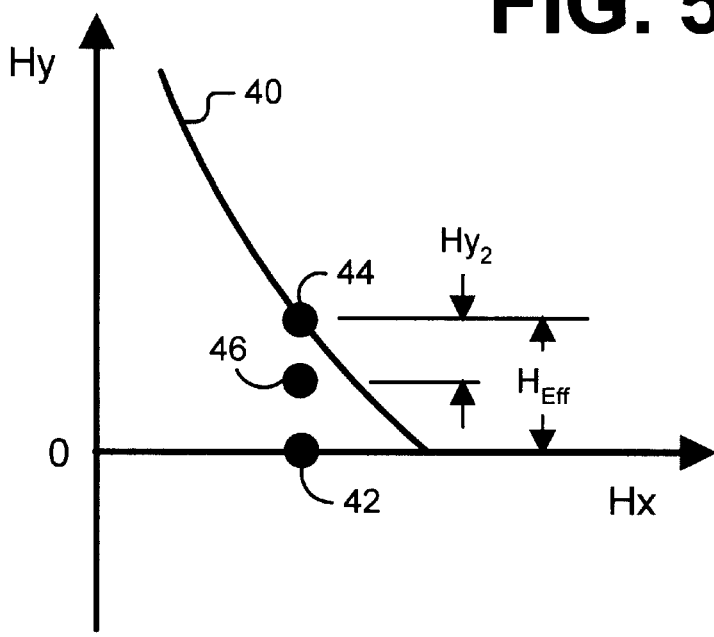
FIG. 6
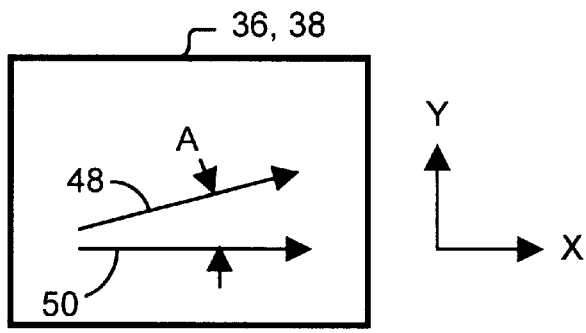
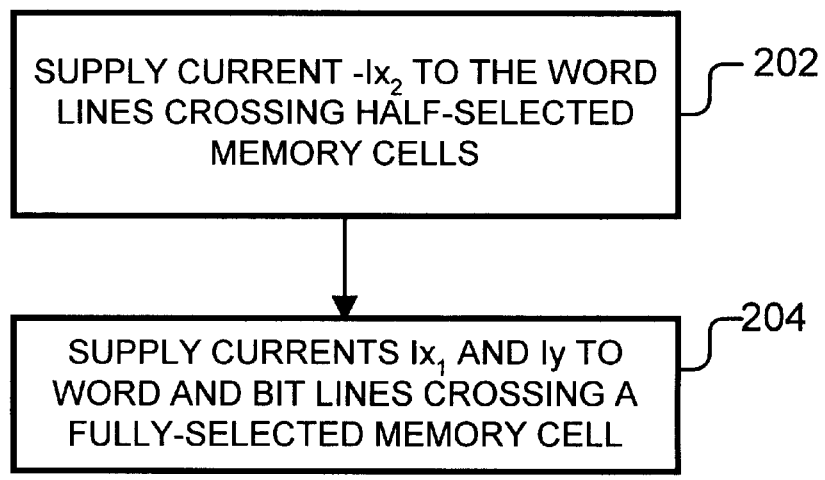
FIG. 8

MRAM DEVICE USING MAGNETIC FIELD BIAS TO SUPPRESS INADVERTENT SWITCHING OF HALF-SELECTED MEMORY CELLS

BACKGROUND OF THE INVENTION

The invention relates to random access memory for data storage. More specifically, the invention relates to a magnetic random access memory device including an array of memory cells and a write circuit for the memory cells.

Magnetic Random Access Memory ("MRAM") is a type of non-volatile memory that is being considered long term data storage. Accessing data from MRAM devices would be orders of magnitude faster than accessing data from conventional long term storage devices such as hard drives. Additionally, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line. A memory cell stores a bit of information as an orientation of a magnetization. The magnetization orientation of each memory cell assumes one of two stable orientations at any given time. These two stable orientations, parallel and anti-parallel, represent logic values of "0" and "1." The magnetization orientation of a selected memory cell may be changed by supplying currents to a word line and a bit line crossing the selected memory cell. The currents create two orthogonal magnetic fields that, when combined, switch the magnetization orientation of a selected memory cell from parallel to anti-parallel or vice versa.

When a memory cell is selected, all of the memory cells along the word line crossing the selected memory cell will see one of the two magnetic fields, and all of the memory cells along the bit line crossing the selected memory cell will see the other of the two magnetic fields. Those memory cells seeing one of the two magnetic fields will hereinafter be referred to as "half-selected" memory cells. Magnetization polarization of all of the half-selected memory cells should be unaffected when a selected memory cell is switched. Otherwise, information stored in half-selected memory cells will be inadvertently erased as bits are written to selected memory cells. In practice, however, switching of the half-selected memory cells can occur. Thus, reliability of storing data in the MRAM device can become a problem.

This problem with the inadvertent switching of half-selected memory cells can become greater as memory cell size is reduced. Thus, reliability of an MRAM device can be further reduced as memory cell size is further reduced. Yet it is always a goal of the industry to reduce cell size to increase memory density. Increasing memory density reduces MRAM cost and size. Suppressing the inadvertent switching of half-selected memory cells would allow cell size to be further reduced.

Therefore, a need exists to suppress the inadvertent switching of half-selected memory cells of MRAM devices.

SUMMARY OF THE INVENTION

Inadvertent switching of half-selected memory cells is suppressed in an MRAM device according to the present invention. According to one aspect of the present invention, a selected memory cell of the MRAM device is written to by applying first, second and third magnetic fields. The second and third magnetic fields are applied to the selected memory cell. The second and third magnetic fields, when combined, switch the selected memory cell. The first magnetic field is applied to half-selected memory cells and may also be applied to the selected memory cell. The first magnetic field has a polarity opposite that of the second magnetic field and a strength that suppresses inadvertent switching of the plurality of the half-selected memory cells.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 2a and 2b are illustrations of parallel and anti-parallel magnetization of a memory cell;

FIG. 3 is an illustration of an MRAM memory cell that has been selected during a write operation;

FIG. 4 is an illustration of magnetization in a free layer of an MRAM memory cell;

FIG. 5 is an illustration of a switching curve for an MRAM memory cell;

FIG. 6 is an illustration of pinned and free layer magnetization of an alternative MRAM memory cell, the magnetization being oriented to provide a magnetic field bias;

FIG. 8 is a flowchart of a method of switching a selected memory cell and suppressing inadvertent switching of half-selected memory cells in the MRAM device of FIG. 7;

DETAILED DESCRIPTION OF THE INVENTION

Figure 1:
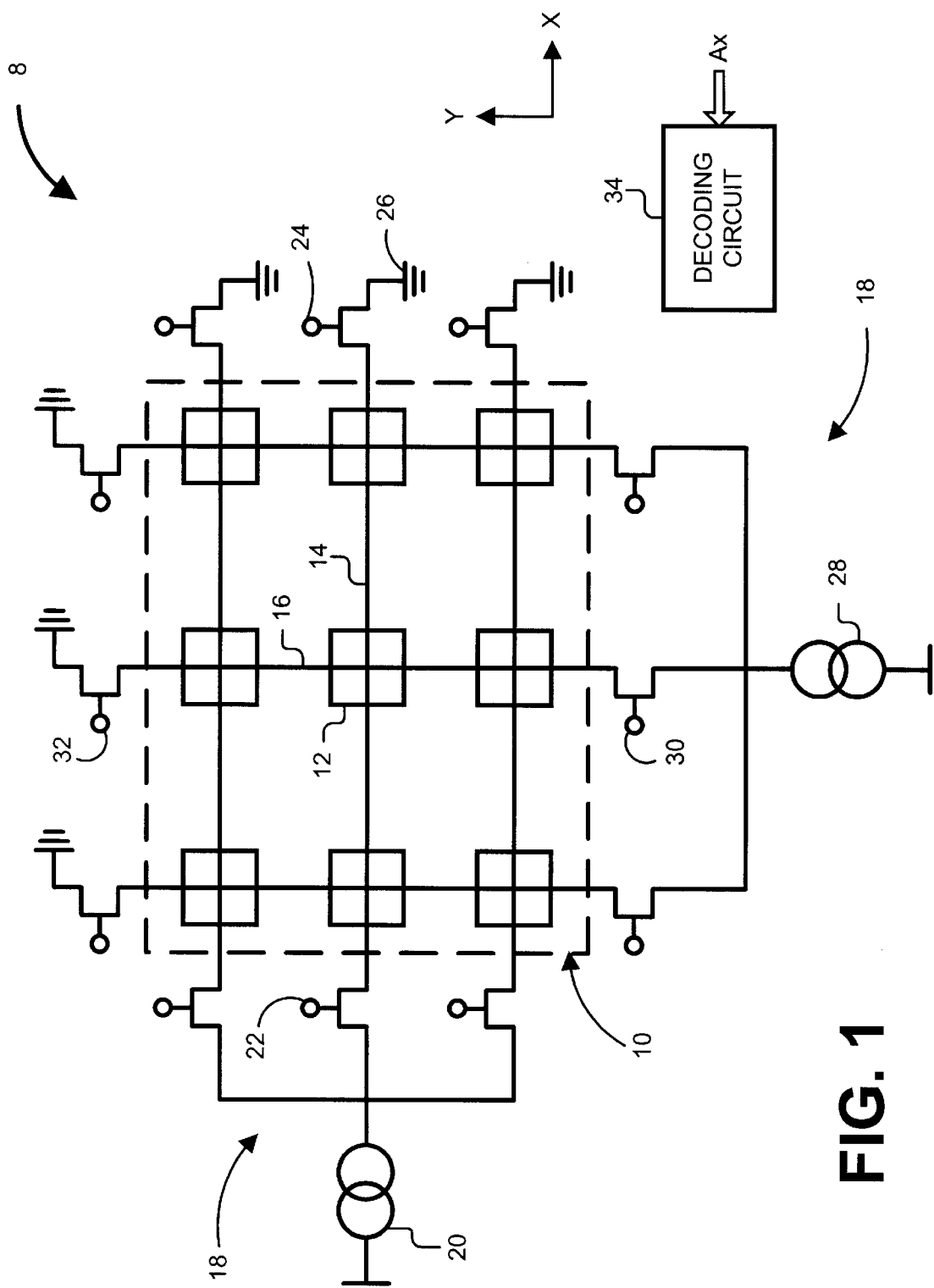
FIG. 1 is an illustration of an MRAM device including an array of memory cells.

As shown in the drawings for purposes of illustration, the present invention is embodied in a Magnetic Random Access Memory device. While a selected memory cell is being written to, a magnetic field bias is applied to half-selected memory cells. The magnetic field bias suppresses the inadvertent switching of the half-selected memory cells, thereby improving data storage reliability of the MRAM device.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024×1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the memory cell array 10. Each memory cell 12 is located at a crossing point of a corresponding word line 14 and bit line 16.

The MRAM device 8 further includes a write circuit 18 for supplying currents Ix and Iy to the word and bit lines 14 and 16 during a write operation. The write circuit 18 includes a word line current source 20 and first and second row select transistors 22 and 24 for each word line 14. Each first row select transistor 22 is coupled between a corresponding word line 14 and the word line current source 20. Each second row select transistor 24 is coupled between a corresponding word line 14 and a reference potential 26 (e.g., ground).

The write circuit 18 further includes a bit line current source 28 and first and second column select transistors 30 and 32 for each bit line. Each first column select transistor 30 is coupled between a corresponding bit line 16 and the bit line current source 28. Each second column select transistor 32 is coupled between a corresponding bit line 16 and the reference potential 26.

Data may be written in m-bit words. If the data is written in m-bit words, a decoding circuit 34 decodes an address Ax and turns on the appropriate row and column select transistors 22, 24, 30 and 32 (traces extending from the decoding circuit 34 to gates of the select transistors 22, 24, 30 and 32 are not shown).

The MRAM device 8 also includes a read circuit for sensing the resistance of each selected memory cell 12. The read circuit is not shown in order to simplify the explanation of the present invention. Additionally, the write circuit 18 has been simplified to simplify the explanation of the present invention. Although only a single word line current source 20 for all of the word lines 14 is shown, the write circuit 18 may include more than one word line current source 20. Although only a single bit line current source 28 for all of the bit lines 16 is shown, the write circuit 18 may include more than one bit line current source 28. Moreover, there are many different ways of connecting switches and current sources to the rows and columns.

The memory cells 12 are not limited to any particular type of device. For example the memory cells 12 may be spin dependent tunneling ("SDT") devices. A typical SDT device includes a "pinned" layer and a "free" layer. The pinned layer has a magnetization that is oriented in a plane, but fixed so as not to rotate in the presence of an applied magnetic field in a range of interest. The free layer has a magnetization orientation that is not pinned. Rather, the magnetization can be oriented in either of two directions along an axis (the "easy" axis) lying in a plane. If the magnetization of the free and pinned layers 36 and 38 are in the same direction, the orientation is said to be "parallel" (as indicated by the arrows in FIG. 2a). If the magnetization of the free and pinned 36 and 38 layers are in opposite directions, the orientation is said to be "anti-parallel" (as indicated by the arrows in FIG. 2b).

The free layer 36 and the pinned layer 38 are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers 36 and 38.

For instance, resistance of a memory cell 12 is a first value R if the orientation of magnetization of the free and pinned layers 36 and 38 is parallel (see FIG. 2a). Resistance of the memory cell 12 is increased to a second value R+ΔR if the magnetization of orientation is changed from parallel to anti-parallel (see FIG. 2b).

Data is stored in a memory cell 12 by orienting the magnetization along the easy axis of the free layer 36. A logic value of "0" may be stored in the memory cell 12 by orienting the magnetization of the free layer 36 such that the magnetization orientation is parallel, and a logic value of "1" may be stored in the memory cell 12 by orienting the magnetization of the free layer 36 such that the magnetization orientation is anti-parallel.

The logic value stored in a selected memory cell 12 may be read by sensing the resistance of the selected memory cell 12. For example, a voltage may be applied across the word and bit lines 14 and 16 crossing the selected memory cell 12, thereby causing a current to be generated. The current can be measured to determine whether the memory cell has a resistance of value R corresponding to one logic value or the value R+ΔR corresponding to the other logic value.

Each memory cell 12 retains the orientation of magnetization, even in the absence of external power. Therefore, the memory cells 12 are non-volatile.

Additional reference is now made to FIG. 3, which illustrates a selected memory cell 12 during a write operation. The magnetization in the free layer 36 of the selected memory cell 12 is oriented by applying the currents Ix and Iy to both the word line 14 and bit line 16 crossing that memory cell 12. Applying the current Ix to the word line 14 causes a magnetic field $Hy_1$ to form around the word line 14. Applying the current Iy to the bit line 16 causes a magnetic field Hx to form around the bit line 16. When a sufficiently large current is passed through both of these lines 14 and 16, the combined magnetic field $Hx+Hy_1$ in the vicinity of the free layer 36 causes the magnetization of the free layer 36 to rotate from the parallel orientation to the anti-parallel orientation, or vice-versa.

When the current Ix is supplied to the word line 14 crossing the selected memory cell 12, additional memory cells 12 along that word line 14 are exposed to the magnetic field $Hy_1$, and when the current Iy is supplied to the bit line 16 crossing the selected memory cell 12, still additional memory cells 12 along that bit line 16 are exposed to the magnetic field Hx. Ideally, these half-selected memory cells should not be switched in the presence of only a single magnetic field. However, "demagnetizing fields" at the ends of the memory cells 12 can increase the likelihood of switching the half-selected memory cells.

Additional reference is now made to FIG. 4, which illustrates magnetization in the free layer 36 of a square memory cell 12. In very small MRAM devices, such as MRAM devices proposed for high storage density memory devices, the demagnetizing field forces the magnetization 4 at end regions of the free layer 36 to align along the edges (e.g., in the y direction). This end magnetization 4 exerts a torque on the rest of the magnetization 5 in the free layer 36 (through ferromagnetic exchange interaction). The torque tends to rotate the magnetization 5 into the y-direction. In effect, the end magnetization 4 helps to switch half-selected memory cells 12.

The torque becomes more prominent as the free layer 36 becomes thicker. For a relatively thin layer (e.g., a free layer having a thickness of about two nanometers), the demagnetizing field from the end magnetization 4 is small and there is a strong dependence of the switching on both fields Hx and $Hy_1$. For a thicker free layer (e.g., a free layer having a thickness of about two nanometers), however, there is a stronger field from the end magnetization 4 and weaker dependence on the one switching field $Hy_1$. This stronger field from the end magnetization 4 can cause the inadvertent switching of a half-selected memory cell 12.

Since a continuous film is deposited to simultaneously form the free layers of multiple MRAM devices, and thickness of the continuous film is subject to normal manufacturing variations, the torque could be more prominent in some devices but not in others. Therefore, the problem of inadvertent switching of half-selected memory cells could arise in certain devices but not in others.

To suppress inadvertent switching of the half-selected memory cells, a magnetic field bias $-Hy_2$. is applied to all of the memory cells 12. Direction of the magnetic field bias $-Hy_2$ is opposite that of the switching field $Hy_1$. Strength of the magnetic field bias $-Hy_2$ may be less than the strength of the switching field $Hy_1$. For example, the strength of the magnetic field bias $Hy_2$ may be about 0.25 of the strength of the switching field $Hy_1$. However, the actual strength of the magnetic fields $Hy_1$ and $Hy_2$ will be device-dependent.

Referring now to FIG. 5, a switching point 42 resulting from the switching field Hx alone (that is, the switching field Hx in the absence of any torque arising from the end magnetization) would fall to the left of the switching curve 40. Therefore the switching field Hx alone would not cause the memory cell 12 to switch. Due to typical manufacturing variations, however, the fields on an actual device may be such that the effective field Heff moves the switching point to 44. Since the switching point 44 lies on the switching curve 40, such an effective field Heff would cause a half-selected memory cell 12 to switch inadvertently. The addition of the magnetic field bias $-HY_2$ pushes the switching point 46, which lies to the right of the switching curve 40. Therefore, the addition of the magnetic field bias $-Hy_2$ suppresses the inadvertent switching of the half-selected memory cell 12.

Various ways in which the magnetic field bias $-Hy_2$ may be applied will be discussed below. One way is shown in FIG. 3. The memory cell 12 includes a portion 13 for providing the magnetic field bias $-Hy_2$. The portion 13 for providing the magnetic field bias $-Hy_2$ may be an independent magnetic film between one of the layers 36 or 38 and the word line 14. Magnetization of the independent film is fixed in the positive y-direction if the effective magnetic field Heff is in the negative y-direction. The independent magnetic film may be made of a variety of magnetic materials. For example, the independent magnetic film may be made of an alloy of cobalt and chrome, the alloy having a thickness comparable to the thickness of the free layer 36. During fabrication of the MRAM device 8, the magnetic film may be deposited and patterned with the word lines 14. In the alternative, the film may be part of the memory cell 12. Such a film could be fabricated along with the memory cells 12.

FIG. 6 shows another way in which the magnetic field bias $-Hy_2$ may be applied. Magnetization 48 of the fixed layer 38 may be angularly rotated relative to magnetization 50 of the free layer 36 by an angle A. Resulting would be a magnetization component in the y-direction and a bias field $-Hy_2$ applied to the device. This rotation of the fixed layer 38 relative to the free layer 36 may be accomplished by annealing the fixed layer 38 in a magnetic field at the angle A.

Figure 7:
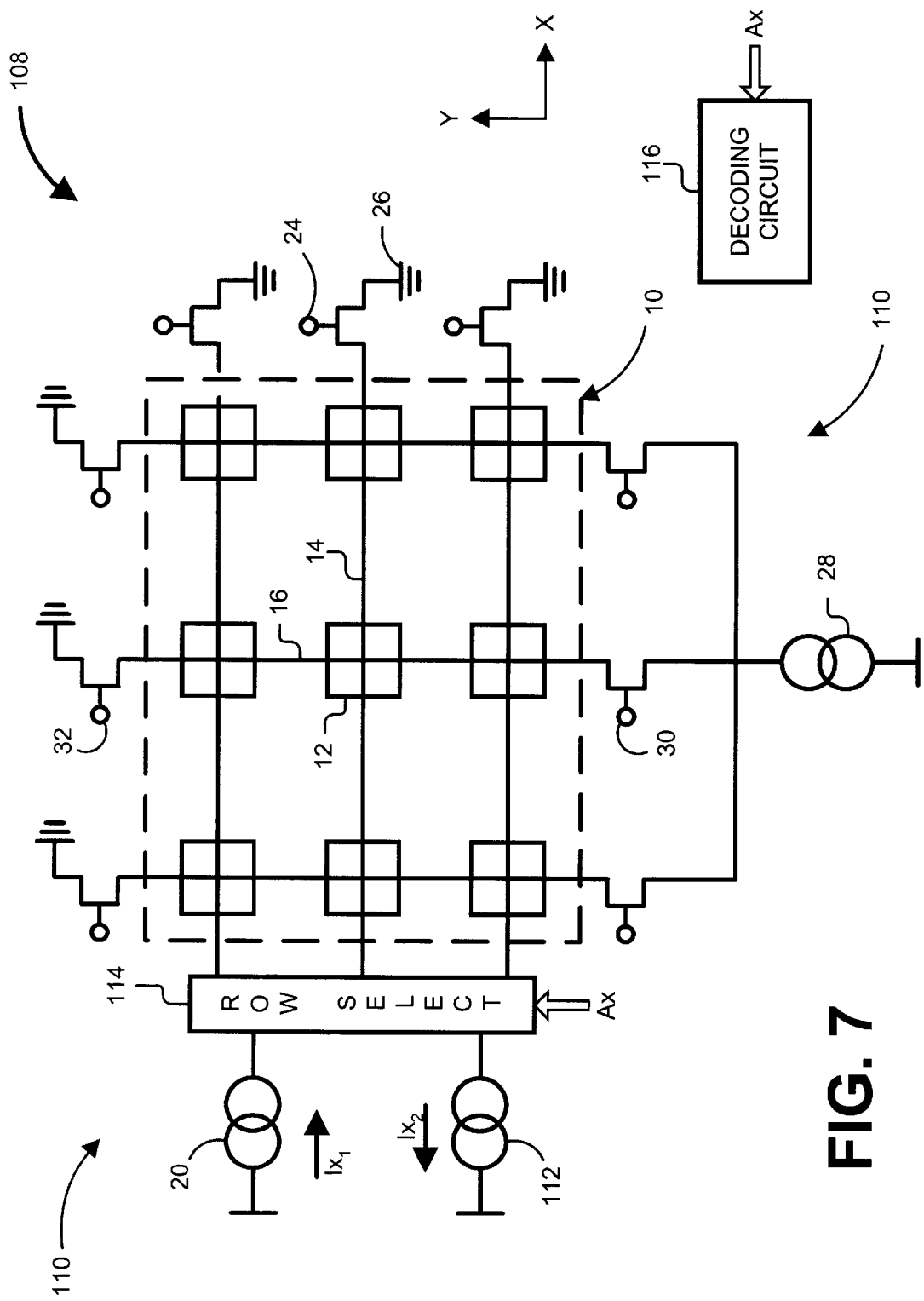
FIG. 7 is an illustration of an alternative MRAM device.

Reference is now made to FIG. 7, which shows another MRAM device 108 and yet another way of applying the magnetic field bias $-Hy_2$. The MRAM device 108 includes an array 10 of memory cells 12. Word lines 14 extend along the x-direction in a plane on one side of the memory cell array 10. Bit lines 16 extend along the y-direction in a plane on an opposite side of the memory cell array 10. Each memory cell 12 is located at a crossing point of a corresponding word line 14 and bit line 16.

The MRAM device 108 further includes a write circuit 110 for supplying currents $Ix_1$, $-Ix_2$ and Iy to the word and bit lines 14 and 16 during a write operation. The write circuit 110 includes a bit line current source 28 for supplying the current Iy, and first and second column select transistors 30 and 32 for each bit line 16.

The write circuit 110 further includes a first word line current source 20 for supplying the current $Ix_2$, a second word line current source 112 for supplying the current $-Ix_2$, row select transistors 24 coupled between the word lines 14 and ground 26, and a row select decoder 114 coupled between the word lines 14 and the current sources 20 and 112.

A decoding circuit 116 decodes an address Ax and turns on the appropriate column select transistors 30 and 32 to supply current Iy to the bit line crossing a selected memory cell 12. The current Iy from the bit line current source 28 causes the magnetic field Hx to be generated about the bit line 16 crossing the selected memory cell 12.

The row select decoder 114 decodes the address Ax and connects the first word line current source 20 to the word line 14 crossing the selected memory cell 12. The current $Ix_1$ from the first word line current source 20 causes the magnetic field $Hy_1$ to be generated about the word line 14 crossing the selected memory cell 12.

The row select decoder 114 also connects the second word line current source 112 to the word lines 14 crossing the half-selected memory cells 12 along the energized bit. The current $-Ix_2$ from the second word line current source 112 causes the magnetic field bias $-Hy_2$ to be generated about the word lines 14 crossing the half-selected memory cells 12. Thus, the magnetic field bias $Hy_2$ suppresses the half-selected memory cells 12 along the energized bit line 16 from being inadvertently switched.

Reference is now made to FIG. 8, which shows a general method of applying the currents $Ix_1$, $Ix_2$ and Iy to the half-selected and fully-selected memory cells 12. The current $-Ix_2$ from the second word line current source 112 is supplied to word lines 14 crossing half-selected memory cells 12 (block 202), and the switching currents $Ix_1$ and Iy are supplied to the word and bit lines 14 and 16 cross a fully-selected memory cell 12 (block 204).

Figure 9:
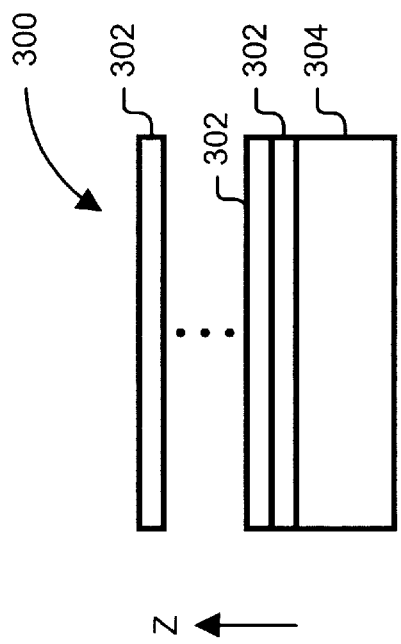
FIG. 9 is an illustration of an MRAM device including multiple layers.

Reference is now made to FIG. 9, which illustrates a multi-level MRAM chip 300. The MRAM chip 300 includes a number N of memory cell levels 302 that are stacked in a z-direction on a substrate 304. The number N is positive integer where $N \geq 1$. The memory cell levels 302 may be separated by insulating material (not shown) such as silicon dioxide. Read and write circuits may be fabricated on the substrate 304. The read and write circuits may include additional multiplexers for selecting the levels that are read from and written to.

Thus disclosed is an invention in which a magnetic field bias suppresses the inadvertent switching of half-selected memory cells. Consequently, reliability of storing data in MRAM devices is increased.

An MRAM device according to the present invention can use lower anisotropy films, such as NiFe, which would normally have a problem with inadvertent switching of half-selected memory cells. Lower anisotropy films typically switch in the presence of smaller magnetic fields. Consequently, an MRAM device according to the present invention can operate at lower power because films that switch in the presence of smaller fields may be used.

An MRAM device according to the present invention may use smaller area memory cells having end effects that are more severe. For instance, square memory cells may be fabricated at the minimum lithographic feature size because effects of the end regions are mitigated. Consequently, higher density memory can be achieved.

MRAM devices according to the present invention can be fabricated with thicker films having stronger demagnetization. Therefore, the devices can be fabricated with higher yield.

Figure 10:
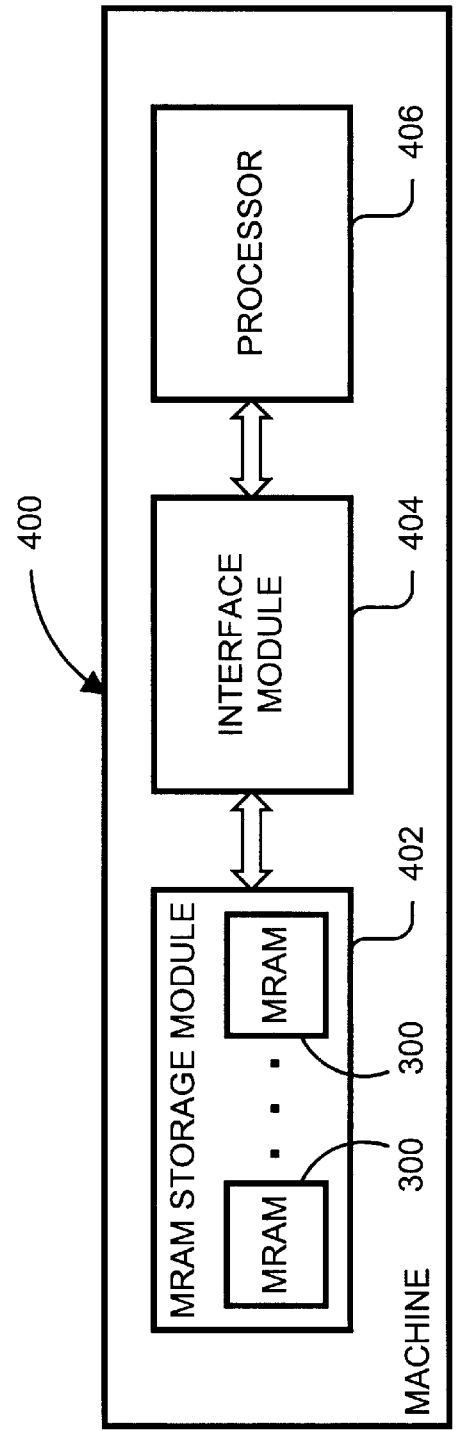
FIG. 10 is an illustration of a machine including one or more MRAM chips.

The MRAM device according to the present invention could be used in a wide variety of applications. FIG. 10 shows an exemplary general application for one or more MRAM chips 300. The general application is embodied by a machine 400 including an MRAM storage module 402, an interface module 404 and a processor 406. The MRAM storage module 402 includes one or more MRAM chips 300 for long term storage. The interface module 404 provides an interface between the processor 406 and the MRAM storage module 402. The machine 400 could also include fast volatile memory (e.g., SRAM) for short term storage.

For a machine 400 such as a notebook computer or personal computer, the MRAM storage module 402 might include a number of MRAM chips 300 and the interface module 404 might include an EIDE or SCSI interface. For a machine 400 such as a server, the MRAM storage module 402 might include a greater number of MRAM chips 300, and the interface module 404 might include a fiber channel or SCSI interface. Such MRAM storage modules 402 could replace or supplement conventional long term storage devices such as hard drives.

For a machine 400 such as a digital camera, the MRAM storage module 402 might include a smaller number of MRAM chips 300 and the interface module 404 might include a camera interface. Such an MRAM storage module 402 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed, in which case the columns would be oriented along the easy axis, and the magnetic field bias would be created about the word lines.

Accordingly, the invention is not limited to the specific embodiments described and illustrated above. Instead, the invention is construed according to the claims that follow.

What is claimed is:

1. An MRAM device comprising:
   an array of junction memory cells;
   rows of first traces crossing the memory cells;
   columns of second traces crossing the memory cells, the first traces being substantially orthogonal to the second traces;
   means for supplying first and second write currents to the first and second traces crossing selected memory cells, the first and second currents creating first and second magnetic fields that cause the selected memory cells to switch; and
   means, external of the memory cells, for applying a third magnetic field to at least some half-selected memory cells to suppress inadvertent switching in free layers of the half-selected memory cells, the third magnetic field being applied while the first and second currents are being supplied to the first and second traces.

2. The device of claim 1, wherein means for applying the third magnetic field includes means for applying a permanent magnetic bias to each memory cell.

3. The device of claim 1, wherein means for applying the third magnetic field includes means for supplying a third current to additional first traces crossing half-selected memory cells.

4. An MRAM device comprising:
   an array of memory cells;
   a plurality of word lines extending in an x-direction, each word line crossing a row of memory cells; and
   a plurality of bit lines extending in a y-direction, each bit line crossing a column of memory cells, the x- and y-directions being substantially orthogonal;
   each memory cell providing a permanent magnetic field bias about at least one of the x- and y-directions, the permanent magnetic bias preventing inadvertent switching in free layers of half-selected memory cells.

5. The device of claim 4, wherein each memory cell includes an independent magnetic film for providing the permanent magnetic field bias.

6. The device of claim 5, wherein the independent magnetic film of each memory cell is deposited on a crossing word line.

7. The device of claim 4, wherein each memory cell includes a pinned layer and a free layer, magnetization of the pinned layer being angularly rotated relative to magnetization of the free layer to apply the permanent magnetic field bias.

8. The device of claim 4, further comprising a substrate and write circuitry on the substrate, the write circuitry being coupled to the first and second traces, wherein the array, the plurality of first traces and the plurality of second traces are included in a first level stacked on the substrate.

9. The device of claim 8, further comprising at least one additional level stacked on the substrate, each additional level including an array of memory cells, a plurality of word lines extending in an x-direction, and a plurality of bit lines extending in a y-direction, each memory cell in the each additional level providing a permanent magnetic field bias about at least one of the x- and y-directions; the write circuitry also being coupled to the first and second traces of each additional level.

10. An MRAM device comprising:
    an array of memory cells;
    a plurality of first traces extending in a first direction, each first trace crossing a corresponding memory cell;
    a plurality of second traces extending in a second direction, each second trace crossing a corresponding memory cell, the first and second directions being substantially orthogonal; and
    write circuitry coupled to the first and second traces, the write circuitry providing first and second write currents to traces crossing selected memory cells;
    the write circuitry supplying a third current to first traces crossing half-selected memory cells; the first and third currents having opposite polarity, the first current being greater than the third current, the third current being applied at the same time as the first and second currents.

11. The device of claim 10, further comprising a substrate carrying the write circuitry, wherein the array, the plurality of first traces and the plurality of second traces are included in a first level stacked on the substrate.

12. The device of claim 11, further comprising at least one additional level stacked on the substrate, each additional level including an array of memory cells, a plurality of word lines extending in an x-direction, and a plurality of bit lines extending in a y-direction, each memory cell in the each additional level providing a permanent magnetic field bias about at least one of the x- and y-directions; the write circuitry also being coupled to the first and second traces of each additional level.

13. A method of writing to a selected memory cell of an MRAM device, the selected memory cell being crossed by first and second traces, the first and second traces being substantially orthogonal, a plurality of additional memory cells also being crossed by the first and second traces, the method comprising the steps of:

using a source to apply a first magnetic field to at least some of the additional memory cells, the source being external of the memory cell;

applying second and third magnetic fields to the selected memory cell while the first magnetic field is being applied to at least some of the additional memory cells, the third magnetic field being substantially orthogonal to the first and second magnetic fields, the second magnetic field having a polarity opposite that of the first magnetic field, the second and third magnetic fields, when combined, causing a free layer of the selected memory cell to switch;

whereby the first magnetic field suppresses inadvertent switching in free layers of the plurality of additional memory cells.

14. The method of claim 13, wherein the first magnetic field is applied by applying a permanent magnetic bias to each memory cell.

15. The method of claim 14, wherein the permanent magnetic bias is applied by the addition of an independent magnetic film to each memory cell, the magnetic film supplying the first magnetic field.

16. The method of claim 13, wherein each additional memory cell along the second trace is crossed by an additional first trace, and wherein current is supplied to each of the additional first traces to apply the first magnetic field to the additional memory cells, the additional memory cells being along the second trace.

17. The method of claim 13, wherein the first magnetic field has a strength of about one-quarter the second magnetic field.

* * * * *